United States Patent [19]

Wiedmann

[11] Patent Number: 4,626,710
[45] Date of Patent: Dec. 2, 1986

[54] LOW POWER LOGIC CIRCUIT WITH STORAGE CHARGE CONTROL FOR FAST SWITCHING

[75] Inventor: Siegfried K. Wiedmann, Stuttgart, Fed. Rep. of Germany

[73] Assignee: International Business Machines Corporation, Armonk, N.Y.

[21] Appl. No.: 719,943

[22] Filed: Apr. 4, 1985

[30] Foreign Application Priority Data

Jun. 8, 1984 [EP] European Pat. Off. ........ 84106534.5

[51] Int. Cl.$^4$ ................. H03K 19/013; H03K 19/084
[52] U.S. Cl. .................................... 307/457; 307/456; 307/460; 307/300; 307/255
[58] Field of Search ............... 307/443, 446, 456–458, 307/255, 460, 280, 300

[56] References Cited

U.S. PATENT DOCUMENTS

| | | | |
|---|---|---|---|
| 3,027,465 | 3/1962 | Di Lorenzo et al. | 307/443 |
| 3,050,640 | 8/1962 | Dillingham et al. | 307/446 X |
| 3,265,906 | 8/1966 | Feller | 307/446 X |
| 3,417,260 | 12/1968 | Foster, Jr. | 307/457 |
| 3,654,486 | 4/1972 | Cubert | 307/300 X |
| 3,956,641 | 5/1976 | Berger et al. | 307/215 |
| 4,069,494 | 1/1978 | Grundy | 357/41 |
| 4,306,159 | 12/1981 | Wiedmann | 307/457 |

OTHER PUBLICATIONS

Gani et al., "Compatible Circuits Implemented in DDL and TTL Technology"; IBM-TDB; vol. 26, No. 5, pp. 2351-2353; 10/1983.
Analysis and Design of Integrated Circuits by D. K. Lynn et al., McGraw-Hill 1967, pp. 246-258.
Circuit Design for Integrated Electronics, by H. R. Camenzind, Addison-Wesley Publishing Company, 1968, pp. 150, 151.
Electronics, Mar. 6, 1967, pp. 149-157 "Integrated Circuits in Action: Part 5 in Search of the Ideal Logic Scheme" by Donald Christiansen.

Primary Examiner—Larry N. Anagnos
Attorney, Agent, or Firm—Robert J. Haase

[57] ABSTRACT

A bipolar logic circuit with superior speed/power characteristics is described. Circuit operation is based on a unique dynamic minority carrier charge exchange mechanism between the input diodes performing the logic and the oppositely poled level shift diode(s) at the input of the transistor output stage. To accomplish this, the input or logic diodes as well as the level shift diode(s) are laid out as large $\tau_s$ diodes with $\tau_s$ being the minority carrier charge storage time constant. Thus, despite very small dc currents during static operation (resulting in an extremely small dc power dissipation) high dynamic switching currents for turning-off as well as for turning-on the output transistors are achieved.

14 Claims, 13 Drawing Figures

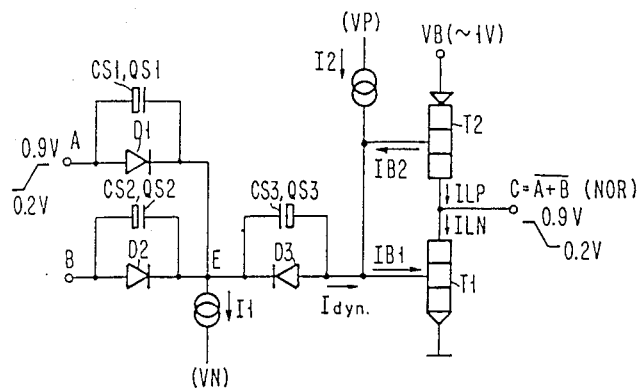
FIG. 1
FIG. 2
| A | B | $C = \overline{A+B}$ (NOR) |
|---|---|---|
| 0 | 0 | 1 |
| 0 | 1 | 0 |
| 1 | 0 | 0 |
| 1 | 1 | 0 |
WITH 0 → LOW
1 → HIGH
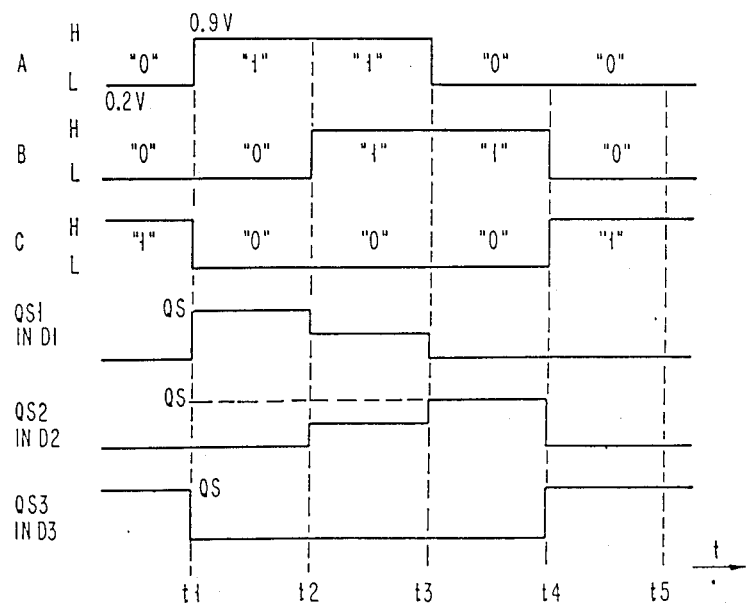
FIG. 3

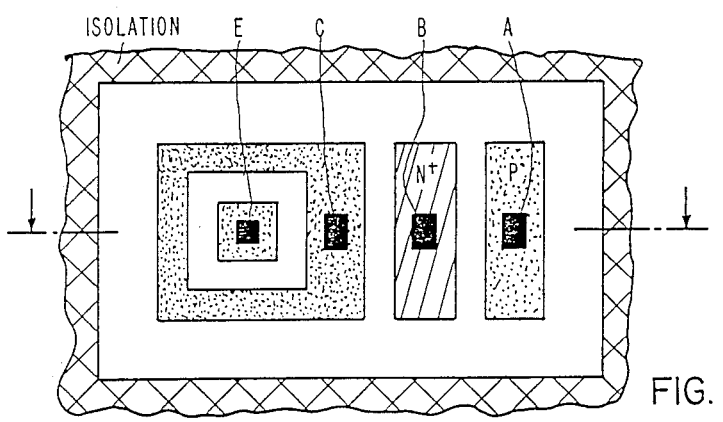
FIG. 7
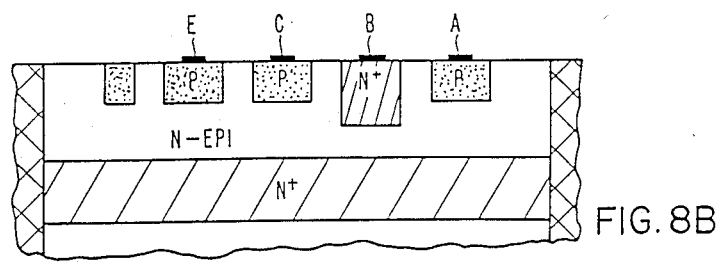
FIG. 8A
FIG. 8B
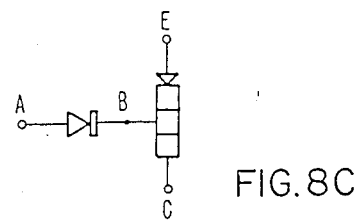
FIG. 8C

LOW POWER LOGIC CIRCUIT WITH STORAGE CHARGE CONTROL FOR FAST SWITCHING

DESCRIPTION

1. Field of Invention

The invention relates generally to logic circuits and more particularly to the improvement of DTC (Diode-Transistor-Logic) type gates.

2. Description of the Prior Art

With an increasingly intensified circuit density on the chip level it becomes more and more important to keep the power dissipation of the logic gates as small as possible and yet achieve switching speeds as high as possible. In the CMOS (Complementary-MOS) type circuitry has been successful in offering an attractive compromise for the above situation; power consumption in CMOS occurs only during transitions from one switching state to another. There is substantially no power consumption associated with the quiescent or steady state.

Many attempts have been tried to translate the CMOS concept to the bipolar circuit technology field. U.S. Pat. No. 3,956,641 (IBM), for instance, shows that this is basically feasible; its practical implementation is, however, still not fully satisfactory. The major difficulty faced is that a bipolar transistor needs an input current supplied to its base which base current has to be limited by suitable circuit means. Not the least because of the bipolar transistor's inherent speed advantage it is still extremely desirable to have available a bipolar logic circuit family with drastically reduced static power consumption while offering high switching speeds during transitions.

Bipolar integrated logic circuits schemes have been proposed in great variety with the DTL circuit family representing one of them. For a more detailed description of DTL circuits reference is made to the following literature which is regarded typical and representative for the technical field to which the invention is related:

Analysis and Design of Integrated Circuits, by D. K. Lynn et al, McGraw-Hill, 1967, pp. 246–258;

Circuit Design for Integrated Electronics, by H. R. Camenzind, Addison-Wesley Publishing Company, 1968, pp. 150, 151;

Electronics, Mar. 6, 1967, pp. 149, 150.

While prior art DTL gates have been modified in various ways to improve their dynamic properties, these attempts have so far focussed exclusively on ways to reduce the turn-off time of the output transistor. To this end there have been proposals to provide the level shift diode(s)—unlike the input diodes—with a certain charge storage capability. Despite the long and intense history of the DTL circuit family, to the present day DTL circuits (as a typical representative of bipolar logic) could not compete satisfactorily with, for instance, CMOS in terms of its speed/power characteristics.

The invention is intended to remedy these drawbacks. It solves the problem of how to devise a bipolar logic circuit which, in a manner similar to CMOS technology, allows the logic gate to operate with very small static power dissipation and yet effect switching or transition operations at very significantly increased circuit speeds.

SUMMARY OF THE INVENTION

According to the present invention, superior speed/power characteristics are achieved in a transistor logic circuit using a unique dynamic minority carrier charge exchange mechanism between input diodes performing the logic and oppositely poled level shift diode(s) coupled between the input diodes and the input of a transistor output stage. The superior circuit efficiency of this logic is based on a specific formation of these diodes as to effect dynamic charge transfer processes to speed up switching actions. To accomplish this, the input or logic diodes as well as the level shift diode(s) are laid out as 'large $\tau_s$ diodes' with $\tau_s$ being the minority carrier charge storage time constant. Thus, despite very small dc currents during static operation (resulting in an extremely small dc power dissipation), high dynamic switching currents for turning-off as well as for turning-on the output transistors are achieved.

BRIEF DESCRIPTION OF THE DRAWINGS

Ways of carrying out the invention are described in more detail below with reference to drawings which illustrate only specific embodiments, in which:

FIG. 1 shows a basic circuit schematic of the improved logic circuit performing a NOR function;

FIG. 2 is a logic function table for the NOR function carried out by the circuit of FIG. 1;

FIG. 3 illustrates time diagrams of the input and output voltage levels as well as of the charge transfer actions;

FIG. 7 is the logic function table of the NAND function performed by the circuit of FIG. 6; and FIGS. 8A-C give an example of a preferred layout of a diode-transistor-structure in a plan view, a sectional view and the equivalent circuit diagram, respectively.

DESCRIPTION OF THE PREFERRED EMBODIMENTS

Figure 4A:
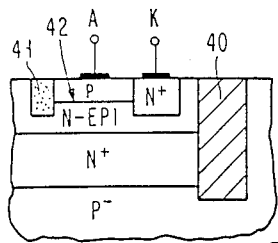
FIGS. 4A-D show a preferred embodiment of a 'large $\tau_s$ diode' structure in a sectional view together with the equivalent electrical symbol and explanatory diagrams.
Figure 4B:
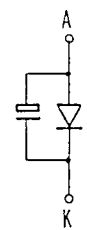
Figure 4C:
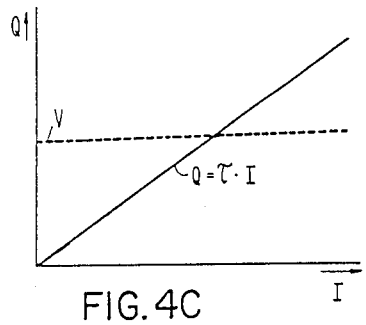

FIG. 1 shows a basic circuit schematic of the improved logic circuit concept which, in principle, provides a minority carrier charge exchange between logic (input) diodes D1, D2 and the oppositely poled level shift diode D3. The superior circuit efficiency of this logic is based on a specific formation (type) of diodes D1, D2, D3 as to effect dynamic charge transfer processes to speed-up switching actions.

Before focussing on the new dynamic design and characteristics of this logic scheme a brief description of its underlying static or dc structure and circuit function will be given. Disregarding for the moment the large minority carrier charge storage time constants of diodes D1, D2 and D3 and their corresponding significant storage capacitance CS1, CS2, CS3—the circuit of FIG. 1 shows a typical conventional input coupled DTL gate. Diodes D1 and D2 perform logic operation, while diode D3 provides offset voltage. If increased noise immunity is desirable, one or more additional diodes are connected in series with D3. Transistors T1 and T2 provide amplification which is associated by logic inversion. In the example shown in FIG. 1 the output stage is formed as a bipolar complementary transistor push-pull driver with NPN transistor T1 and PNP transistor T2 connected between the power supply voltage terminals VB and ground. While this is the preferred type, other push-pull drivers may be used as well. A preferred value of the supply voltage VB is between one and two transistor VBEs, i.e. between about 0.7 and 1.4 V, for instance, 1 V. current sources I1, I2 are indicated schematically and provide dc current for the static operation of the gate; these current sources can be formed conventionally by providing a (typically large) resistor connected to a corresponding voltage source which is indicated in FIG. 1 as VP and VN standing for a potential which is more positive/negative relative to the anode/cathode potential of D3. Of course, current sources may likewise be formed with transistor circuits an example of which will be given later.

If at least one of the two inputs A, B is at high potential, for instance 0.9 V, current I1 flows via diode D1 or diode D2. The potential at node E is high enough, for instance 0.2 V, to keep diode D3 substantially non-conducting. Thus current I2 is fed into the base of NPN transistor T1 causing T1 to be conducting which results in output C of about 0.2 V corresponding to the low signal level. At the same time the base-emitter voltage of PNP transistor T2 is small enough to keep T2 practically off.

Only with both inputs A and B being at their low level, both input diodes D1, D2 are non-conductive and current I1 is drawn via diode D3. As a result, a base current IB2=I1−I2 flows which causes PNP transistor T2 to turn on. This applies in the assumed case where I1 >I2, e.g. I1=2×I2. Under these circumstances the base-emitter voltage of NPN transistor T1 is small enough to cause T1 to be practically non-conducting which results in output C assuming the high signal level state.

From the above it is seen that the gate of FIG. 1 performs a NOR function since output C is at its down level whenever at least one of inputs A, B assumes an up level. This is further illustrated in the logic table of FIG. 2 based on a "positive logic" agreement where the binary zero represents a down or low level and the binary one represents the upper or high level. Of course it is known that a different logic/level definition, e.g. "negative logic", can be assumed resulting in a corresponding change in the logic function performed. Regarding further details of DTL circuit structure or function reference is made, for instance, to the aforementioned book of D. K. Lynn et al Analysis and Design of Integrated Circuits, McGraw-Hill 1967.

As already mentioned before, the superior speed/power characteristics of the proposed logic is based on a unique dynamic minority carrier charge exchange mechanism. To accomplish this it is important that the input or logic diodes D1, D2 as well as the level shift diode(s) D3 be laid out as 'large $\tau_s$ diodes' ($\tau_s$ being the minority carrier charge storage time constant) as will be explained in more detail below, i.e. diodes D1, D2, D3 should have a significant storage capacitance which is indicated in FIG. 1 as CS1 for D1, CS2 for D2 and CS3 for D3. In case of more than two inputs the same would apply, of course, for the further input diodes. It is the main idea of this invention that despite very small dc currents possible (i.e. meaning a desirably small dc power dissipation), high dynamic switching currents for turning off as well as for turning on the output transistors are achieved resulting in a very significant speed/power improvement.

For describing the improved dynamic circuit function of FIG. 1 additional reference is made to FIG. 3 illustrating schematically time diagrams of the input and output voltage levels as well as the aforementioned charge exchange mechanism. H and L stand for 'High' and 'Low' level at the input/output terminals. QS1, QS2, QS3 represent the charge amounts stored at a time in diodes D1, D2, D3.

As explained earlier depending on the input conditions, either diode D3 or at least one of diodes D1, D2 are conducting. The minority carrier charge stored in the conductive state is QS=I1×$\tau_s$ with $\tau_s$ representing the charge storage time constant of the diode. With both inputs A and B being at low level—shown in FIG. 3 in the time period preceding t1—diode D3 stores in the quiescent state a minority carrier charge QS3=QS. As at time t1 input A switches to the high level, diode D3 becomes non-conducting as described earlier for the static circuit operation. This switching operation effects the discharging of CS3 associated with D3 where the storage charge QS involved is conveyed to the storage capacitance CS1 associated with input diode D1. Further the same charge amount QS is pumped into the base-emitter diode of transistor T1 of the output stage. The corresponding dynamic current Idyn resulting from that is supplied by the output driver of the preceding stage which applies input signal A. The rather large charge QS being fed momentarily into transistor T1 effects an immediate output or load current IL according to the following relation:

$$QS=I1\times\tau_s=ILN\times\tau_N$$

where ILN and $\tau_N$ represent collector current and switching time constant of NPN transistor T1. From this the following applies:

$$ILN=I1\times\tau_s/\tau_N$$

This means that during switching a considerably higher dynamic transient current ILN is provided which, compared to current I1 in the quiescent state, is increased by a factor of $\tau_s/\tau_N$. With today's standard technology and circuit design possibilities typical values of $\tau_N\approx0.050$ ns and $\tau_s\approx50$ ns are achievable. As a result it is possible to increase the dynamic current and thus the switching speed by some orders of magnitude (e.g. by a factor of $10^3$) over the dc current during static operation. To give an example, the NOR gate of FIG. 1 with a dc current as small as I1=1 μA offers the same circuit speed as a conventional DTL gate with a dc current of 1 mA.

With continued reference to FIGS. 1 and 3, input A is as to go back to a low level illustrated at time t3 FIG. 3. Then storage charge QS1 is returned from diode D1 to diode D3, i.e. compared to the transition operation at time t1 described before the reverse charge transfer action takes place. The large dynamic current resulting from this charge exchange performs a very fast discharge of the base-emitter diode of NPN transistor T1 and causes PNP transistor T2 to turn on at a significantly accelerated rate. For the transient collector current of PNP transistor T2 the relation applies:

$$ILP \simeq I1\times\tau_s/\tau_p$$

With both inputs A and B assuming their high level state—illustrated at time t2 in FIG. 3—the storage charge QS is distributed among both diodes D1 and D2. If now one input, for instance, input A at time t3 is switched to its low level, no change occurs at output C while, however, the full amount of charge QS is transferred to diode D2. Since no (current limiting) resistors are provided in the turn-on/turn-off current paths involved, very large transient currents can be generated.

For application as offset as well as logic diodes in the above-stated context, FIG. 4 illustrates one possible structural embodiment (FIG. 4A) together with the equivalent circuit diagram (FIG. 4B) of such a 'large $\tau_s$ diode' the required characteristics of which have also been explained earlier. It is apparent from FIG. 4A that the diode structure can be formed by conventional techniques applying, for instance, deep reaching isolation regions 40 of a recessed oxide (ROX) and/or guard ring structures 41 of ROX or in the form of highly doped regions (e.g. of the N+ type in the FIG. 4A example). On the basis of a common bipolar IC layer structure (P− substrate, N+ subcollector, N− epitaxy) the diode is formed by the P base/N epi junction 42 with an N+ cathode contact region underneath cathode terminal K. That PN junction 42 exhibits a substantially larger storage time constant $\tau_s$ than a fast switching transistor. Through selective adjustment of its doping and geometry, diode characteristics with the desired large $\tau_s/\tau_N$ or $\tau_s/\tau_p$ ratio are obtainable.

For the selection of suitable further diode structures and a more comprehensive survey of available diode characteristics in relation to specific configurations renewed reference is being made to the D. K. Lynn et al book as well as the further art mentioned before which is hereby incorporated by reference.

Figure 4D:
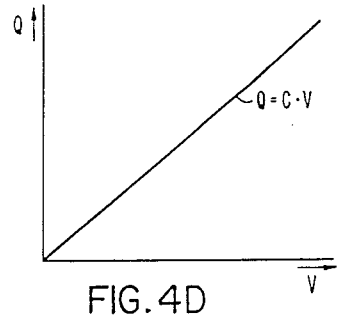

As a result it is to be noted that for the proposed dynamic logic concept it is essential that not only the level shift or offset diode D3 but also the logic or input diodes are formed as large $\tau_s$ diodes, i.e. as storage diodes with the charge being dependent primarily on the current; any normal or junction depletion capacitance with the charge being essentially proportional to the voltage applied would be detrimental to the desired improvement as were other parallel capacitances. An illustration of the desirable charge (Q) and voltage (V) characteristic of these diodes is given in FIG. 4C. For comparison FIG. 4D shows the characteristic of a "normal" capacitance mentioned before.

Figure 5:
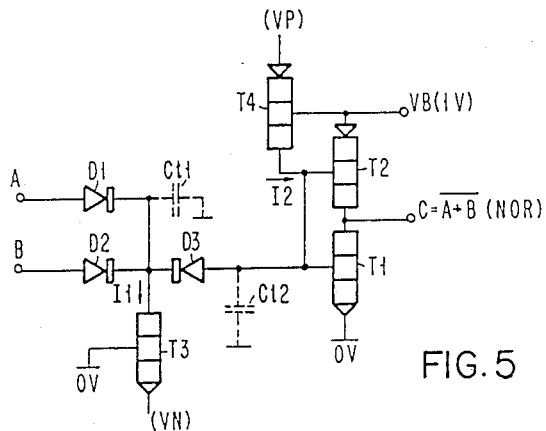
FIG. 5 shows a more detailed circuit diagram of the schematical embodiment of the circuit of FIG. 1.

FIG. 5 shows a more detailed circuit diagram of the schematical embodiment of FIG. 1 whereby same parts bear same designations. Current sources I1, I2 of FIG. 2 are formed by NPN transistor T3 and PNP transistor T4 each in common base circuit and connected to a corresponding supply source. The specific symbols used for diodes D1, D2, D3 are to indicate that these diodes are large $\tau_s$ diodes, i.e. these diode symbols are to be understood as already including the minority carrier charge storage capacitances denoted CS1, CS2, CS3 in FIG. 1.

In addition to the FIG. 2 circuit diagram, parasitic junction capacitances Ct1, Ct2 are indicated in FIG. 5 which had been neglected previously in order to facilitate a better understanding of the basic idea. While, naturally, the influence of those parasitic capacitances somewhat impairs the circuit speed this loss can be kept, however, rather small when the storage charge QS is large relative to the ΔQ in the parasitic capacitances. In other words, QS has to compensate the ΔQ of the junction capacitances.

From the above the following relation applies:

$$QS = I1 \times \tau_s > Ct1 \times \Delta V1 + Ct2 \times \Delta V2$$

with ΔV1, ΔV2 representing the corresponding voltage swings.

Figure 6:
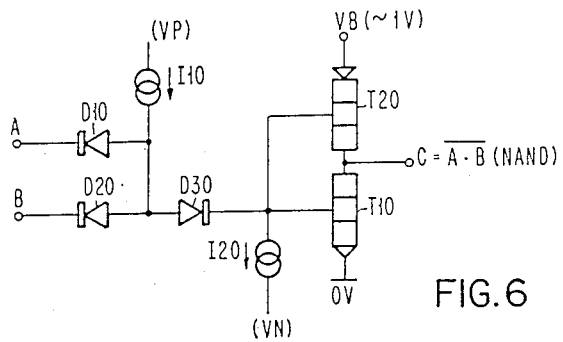
FIG. 6 shows a further embodiment of the invention performing a NAND function.

FIG. 6 depicts another embodiment of the invention which performs a NAND function. The logic gate of FIG. 6 is structured by applying the duality principle to the NOR gate of FIGS. 1 or 5. Accordingly similar designations are used with diodes D10, D20, D30 corresponding to D1, D2, D3 etc. If one of the two inputs A, B is at down level, D30 is reversed biased and no base current is fed into T10 so that output C is at its up level. Only if all two inputs are at a potential high enough to keep D10, D20 non-conductive, current source I10 feeds a base current via the then conducting D30 into T10 causing output 10 to drop to VCES (collector emitter saturation voltage), i.e. to its down level. FIG. 7 shows the resulting NAND function (for "positive logic") in the form of a function table similar to FIG. 2. It is to be noted, again, that the principle or mechanism of minority carrier charge exchange in 'ping-pong fashion' with regard to the distinct circuit states is the very same as explained earlier in greater detail with reference to FIGS. 1 to 3.

FIG. 8 gives an example of a preferred dense layout of a diode-transistor structure. In particular it illustrates how diode D30 and PNP transistor T20 of FIG. 6 can be integrated. FIGS. 8A, B, C depict a plan view, a sectional view and the equivalent circuit diagram, respectively. E, C, B, A represent the emitter, collector, base (or cathode) and anode terminals contacting their corresponding doping regions. The PNP transistor is formed as lateral transistor with P emitter (contact E), N− epitaxy as base, and P collector (contact C). The N+ region with contact B serves as base and diode cathode contact region. The PN junction of the diode is formed by the P anode region (with contact A) and N− epitaxy surrounding the latter P region. Underneath said structure a N+ subcollector region may be provided. Isolation may be made by any of the conventional techniques, preferably by providing a dielectric isolation.

Summarizing, the disclosed new logic concept allows, in a manner similar to CMOS technology, the circuits to operate at very small dc currents (i.e. small dc power consumption) and yet effecting switching/transition operations at a significantly and dynamically increased circuit speed. The circuit concept can be implemented conveniently in any standard bipolar process technology. By tailoring the corresponding doping and dimensional parameters almost ideal circuit performance conditions are obtainable.

While the embodiments used semiconductor elements or structures or regions of a certain conductivity type it is clear that the invention is not restricted thereto. The same applies for the assumed level/logic correlations, the poling of diode junctions as well as current and voltage sources etc. Similarly the proposed logic can be implemented with other fan-in and fan-out numbers without departing from the spirit of the invention. Further, for the output stage(s) other driver circuits are applicable although push-pull types and among these those with complementary transistors are preferred. Finally it is generally known that diode structures can be implemented in many different ways, e.g. as genuine PN junctions or as transistor diodes etc.

I claim:

1. A logic circuit with input diodes each connecting an input with a common circuit node, a transistor output stage and one or more level shift diodes connecting said common circuit node and the input of said transistor output stage, each said level shift diode being poled oppositely with respect to said input diodes, characterized in that the input diodes as well as each level shift diode are designed as large $\tau_s$ diodes, $\tau_s$ being the minority carrier charge storage time constant, so that they are adapted to effect a dynamic exchange of minority carrier charges therebetween during input level transitions, providing a dynamic switching current which is substantially increased over an underlying small static dc current.

2. The logic circuit of claim 1, wherein each said input diode as well as each said level shift diode are associated with an inherent minority carrier charge storage capacitance whose stored charge is dependent substantially on the current rather than on the applied voltage.

3. The logic circuit of claim 2, wherein each said diode is a junction diode and the charge stored in said inherent minority carrier storage capacitances of each said diode is large compared to the charge storage in the parasitic junction capacitances associated with said diodes.

4. The logic circuit of claim 1, 2 or 3 and further including a first dc current source connected to one side of said level shift diode at said common circuit node and a second dc current source connected to the other side of said level shift diode at the input of said transistor output stage.

5. The logic circuit of claim 4, wherein the current supplied by said first dc current source is greater than the current supplied by said second dc current source.

6. The logic circuit of claim 5, wherein the ratio of currents supplied by said first and second dc current sources is a factor of about $\geq 2$.

7. The logic circuit of claim 4 wherein static operation currents in the $\mu A$ range are applied by said dc current sources.

8. The logic circuit of claim 1, 2 or 3 wherein the dynamically available switching current is increased over the statically impressed dc operation current by a factor $\tau_s/\tau_n \approx 10^2$ to $10^3$ with $\tau_s$ representing the minority carrier charge storage time constant of said input or level shift diode and $\tau_N$ representing the switching time constant of the transistor of said output stage.

9. The logic circuit of claim 1, 2 or 3 wherein the output stage comprises a bipolar transistor push-pull driver circuit.

10. The logic circuit of claim 9 wherein the push-pull driver circuit contains transistors of complementary conductivity types.

11. The logic circuit of claim 1, 2 or 3 wherein the anodes of said input diodes are connected to the logic circuit input terminals and adapted to perform a NOR function.

12. The logic circuit of one of claim 1, 2 or 3 wherein the cathodes of said input diodes are connected to the logic circuit input terminals and adapted to perform a NAND function.

13. The logic circuit of claim 1, 2 or 3 wherein $\tau_s$ is of the order of 50 nanoseconds.

14. The method of operating a logic circuit of the type set forth in claim 1, 2 or 3 comprising
in the quiescent state, providing for the logic circuit a very small static current flow in the $\mu A$ range while maintaining a minority carrier charge stored in at least one of said input or said level shift diodes;
in the transitional phase, providing a dynamic minority carrier charge exchange between the input and level shift diodes in a 'ping-pong fashion' with a resulting switching current increase effecting the speed-up for the turning-off as well as the turning-on of the transistor of the output stage.

* * * * *